(12) United States Patent
Uchida

(10) Patent No.: US 7,652,344 B2
(45) Date of Patent: Jan. 26, 2010

(54) SEMICONDUCTOR DEVICE

(75) Inventor: Shinichi Uchida, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 40 days.

(21) Appl. No.: 11/853,064

(22) Filed: Sep. 11, 2007

(65) Prior Publication Data

US 2008/0061397 A1 Mar. 13, 2008

(30) Foreign Application Priority Data

Sep. 12, 2006 (JP) ............................. 2006-247031

(51) Int. Cl.
*H01L 29/00* (2006.01)
(52) U.S. Cl. ................ 257/508; 257/758; 257/E21.642
(58) Field of Classification Search ................ 257/409, 257/501, 508, E21.642, 758, E27.062, E23.002
See application file for complete search history.

(56) References Cited

U.S. PATENT DOCUMENTS

2006/0012003 A1* 1/2006 Mallikarjunaswamy et al. .......................... 257/501
2006/0102980 A1 5/2006 Nakashiba

FOREIGN PATENT DOCUMENTS

JP 2006-147668 6/2006

* cited by examiner

*Primary Examiner*—Thomas L Dickey
*Assistant Examiner*—Fazli Erdem
(74) *Attorney, Agent, or Firm*—Young & Thompson

(57) ABSTRACT

A semiconductor device that can suppress noise transmission through a seal ring provided between two device regions. The semiconductor device includes a logic unit and an analog unit. The semiconductor device further includes a silicon substrate, an insulating interlayer, a seal ring surrounding the outer periphery of the logic unit composed of a conductive film buried in the insulating interlayer, a well provided on the silicon substrate, and an N well guard ring that blocks conduction of a path from the logic unit, through the seal ring to the analog unit. The N well guard ring is disposed between the seal ring region 106 and the logic unit or the analog unit.

14 Claims, 11 Drawing Sheets

SEMICONDUCTOR DEVICE

BACKGROUND OF THE INVENTION

1. Field of the Invention

The present invention relates to a semiconductor device and more particularly to a semiconductor device having plural device regions and seal ring.

2. Description of Related Art

In order to protect a circuit-forming region in a semiconductor chip effectively from moisture, a protective structure referred to as a "seal ring" is provided so as to surround the semiconductor device (chip). The seal ring is formed with a wiring layer as in the circuit-forming region and a via (or contact).

Generally, however, the seal ring is electrically connected to a semiconductor substrate, so that noise that is apt to be generated in the device region of a digital circuit chip or the like is often transmitted to another device region through the seal ring, thereby causing malfunction of the elements provided in another region.

Japanese Unexamined Patent Application Publication No. 2006-147668 discloses a conventional method for suppressing such noise transmission. According to the method, a nonconducting part is provided in a seal ring forming region so that the nonconducting region blocks the conduction of a path from a logic unit, through the seal ring to an analog unit.

SUMMARY

The method disclosed in Japanese Unexamined Patent Application Publication No. 2006-147668 will be effective to suppress noise transmission from the seal ring to the semiconductor substrate in a normal line of the substrate.

However, after investigation, the present inventor has found that there is still room for further improvement in suppression of the noise transmission according to the method disclosed in Japanese Unexamined Patent Application Publication No. 2006-147668.

Under such circumstances, it is an object of the present invention to provide a semiconductor device having first and second device regions. The semiconductor device further includes a semiconductor substrate; an insulating interlayer formed on the semiconductor substrate; a seal ring formed with a conducting film buried in the insulating interlayer so as to surround the outer periphery of the first device region; and a blocking region composed of a well provided on the semiconductor substrate and blocking a noise transmission path from the first device region to the second device region through the seal ring. The second device region is disposed inside or outside the sealing ring and the blocking region disposed between the seal forming region and the first or second device region.

As described above, noise generated in a predetermined device region is transmitted to another device region through a seal ring, thereby causing malfunction of an element provided in another device region sometimes.

In order to suppress such noise transmission, the present invention provides the semiconductor device with a blocking region (guard ring) in a region between the seal ring forming region and the first or second device region. The blocking region (guard ring) is composed of a well provided on the semiconductor substrate. Due to the guard ring composed such way, noise transmission in an in-plane direction of the semiconductor substrate is suppressed effectively even in a case where the noise transmission in that direction is dominant. Consequently, the guard ring can suppress malfunction, etc. of each element provided in the first or second device region. In this case, the impurity concentration profile of the well is not limited specially, so that various types of profiles can be adopted.

The term "blocking region" (guard ring) mentioned above means a region used to block the conduction of a noise transmission path from the first device region to the second device region through the seal ring, thereby insulating the first and second device regions from each other. The blocking region is provided in a region between the first device region and the seal ring forming region or between the second device region and the seal ring forming region and acts to block the conduction of the semiconductor substrate in its in-plane direction in the above region.

Generally, the impedance Z in a region is represented by the following equation (1):

$$Z = R + j(\omega L - 1/\omega C) \qquad (1)$$

(wherein, $\omega$ is a frequency, R is an electric resistance, L is a self-inductance, C is a capacity, and j is an imaginary unit.)

According to the present invention, the blocking region has a function for suppressing transmission of noise generated in one of the first and second device regions to the other region on a level that produces no practical problem while an absolute value of the impedance Z represented in the equation (1) (herein after, the absolute value of the right side in the equation (1) will be simply referred to as Z or an impedance) is high enough.

Concretely, the blocking region composed of a well will take one of the following forms:

(i) A PN junction plane formed between a well and its adjacent region (ii) A path that enables a current to flow from a semiconductor substrate to external through the well The (i) decreases C and increases Z in the above equation (i). In the equation (i), $\omega L$ is smaller enough than $1/\omega C$. If C is reduced, then Z is increased. In an example of the (i) configuration, a well that constitutes a blocking region forms a PN junction with an adjacent region in the semiconductor substrate at its side. At this time, if C is decreased in size in the above equation (i), Z can be increased favorably. And if a boundary phase between the side of the well and its adjacent region is formed as a PN junction plane, noise transmission in the in-plane direction of the semiconductor substrate is suppressed effectively.

The above (i) configuration is particularly effective if an analog or digital circuit element is formed in any one of the first and second device regions. If noise generated from any of the digital circuit elements is transmitted through the above path in the above (i) configuration and the total capacity C in the path is reduced effectively, the impedance Z is increased favorably. This effect appears remarkably when $\omega$ is small in the above equation (i), thereby low frequency noise transmission is suppressed effectively.

The above (ii) configuration is effective to transmit noise preferentially to the path provided so as to have a relatively smaller Z value than that in the substrate in-plane direction in the above equation (1). As an example of the (ii) configuration, there has been proposed a form in which a blocking region is composed of a well having the same conduction type as that of the semiconductor substrate and the well is fixed at a predetermined potential. In this case, because the well is fixed at a predetermined potential and noise is escaped to the fixed potential side, noise transmission in the in-plane direction of the semiconductor substrate is suppressed effectively.

Blocking the conduction by a blocking region such way is just required to reduce the noise transmission level to or under a predetermined one. If the conduction blocking can suppress noise transmission at this time, a weak current is allowed to flow in the blocking region.

As described above, according to the present invention, a blocking region is composed of a well formed on a semiconductor substrate. The blocking region blocks the conduction in the in-plane direction of the semiconductor substrate in a path from the first device region to the second device region through the seal ring, so that noise transmission between the first and second device regions is suppressed surely.

The blocking region may be, for example, a member provided at a side of the seal ring and along the seal ring. However, the blocking region may not always be provided along the seal ring. For example, the blocking region may be a member that surrounds at least part of the first device region provided in the center of the semiconductor substrate.

The blocking region is just required to be structured so as to suppress any one of the following:

(I) Noise transmission in the in-plane direction of the semiconductor substrate in a region between the first device region and the seal ring forming region
(II) Noise transmission in the in-plane direction of the semiconductor substrate in a region between the second device region and the sea ring forming region The planar shape of the blocking region may be changed to a ring shape. However, the shape is not limited only to a perfect closed ring; part of the ring may be chipped and part of the ring may be isolated by an insulating interlayer if the above (I) or (II) can be suppressed.

The seal ring is just required to surround at least the first device region; the second device region may be disposed inside or outside the seal ring. This means that the second device region may be provided closer to the dicing line side than the seal ring.

In this specification, the "seal ring forming region" means a ring-shaped region including the seal ring in a plan view regardless of whether the seal ring is a perfect ring or not. This ring-shaped region includes not only the seal ring, but also the semiconductor substrate and an insulating interlayer provided on the semiconductor substrate.

According to the present invention, therefore, it is possible to effectively suppress noise transmission through a seal ring provided between two device regions.

DETAILED DESCRIPTION OF THE PREFERRED EMBODIMENTS

Figure 1:
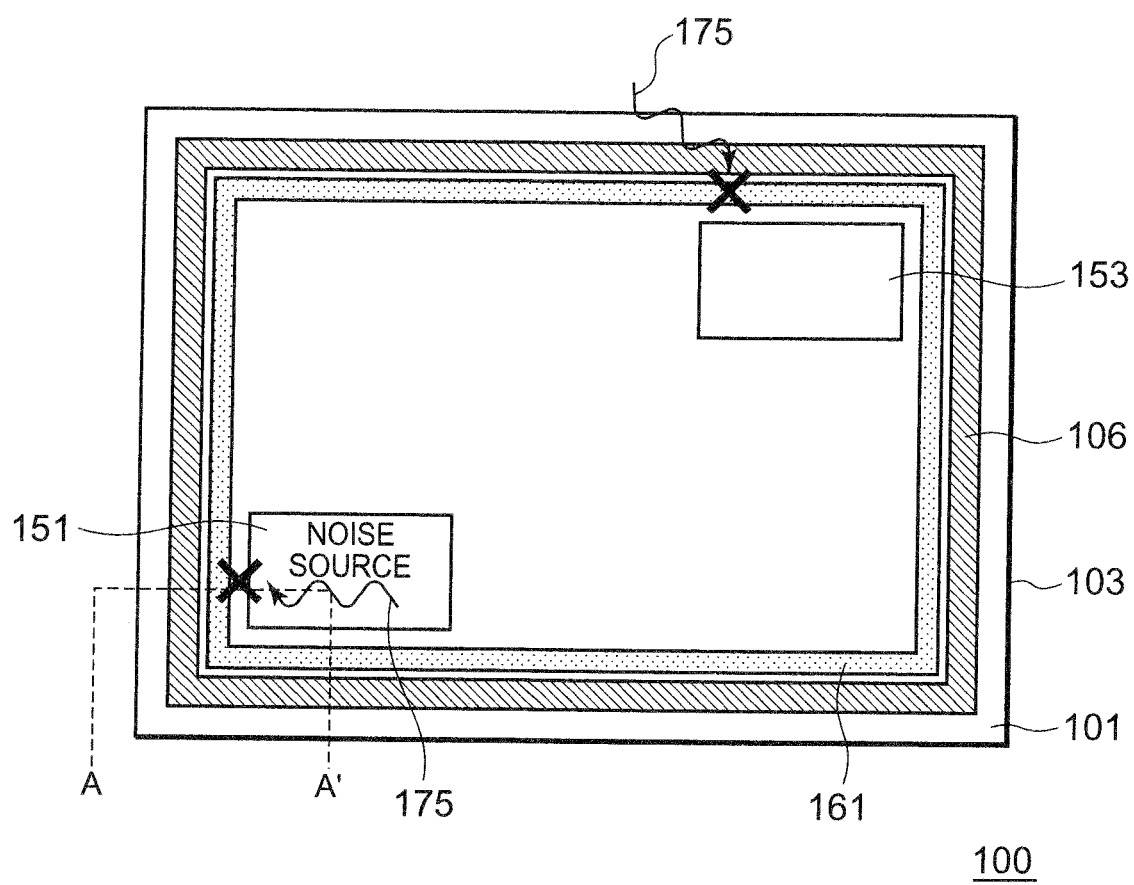
FIG. 1 is a top view of a schematic configuration of a semiconductor device in an embodiment.

Hereunder, the preferred embodiments of the present invention will be described in detail with reference to the accompanying drawings. In all those drawings, the same reference numerals will be used for the same components, avoiding redundant description.

In the embodiments to be described below, it is premised that a seal ring is provided along the periphery of a semiconductor substrate. However, the present invention is not limited only to those embodiments; the seal ring may be provided in any region of a device forming plane. This will be described in detail later with reference to FIGS. 10 and 11.

First Embodiment

Figure 2:
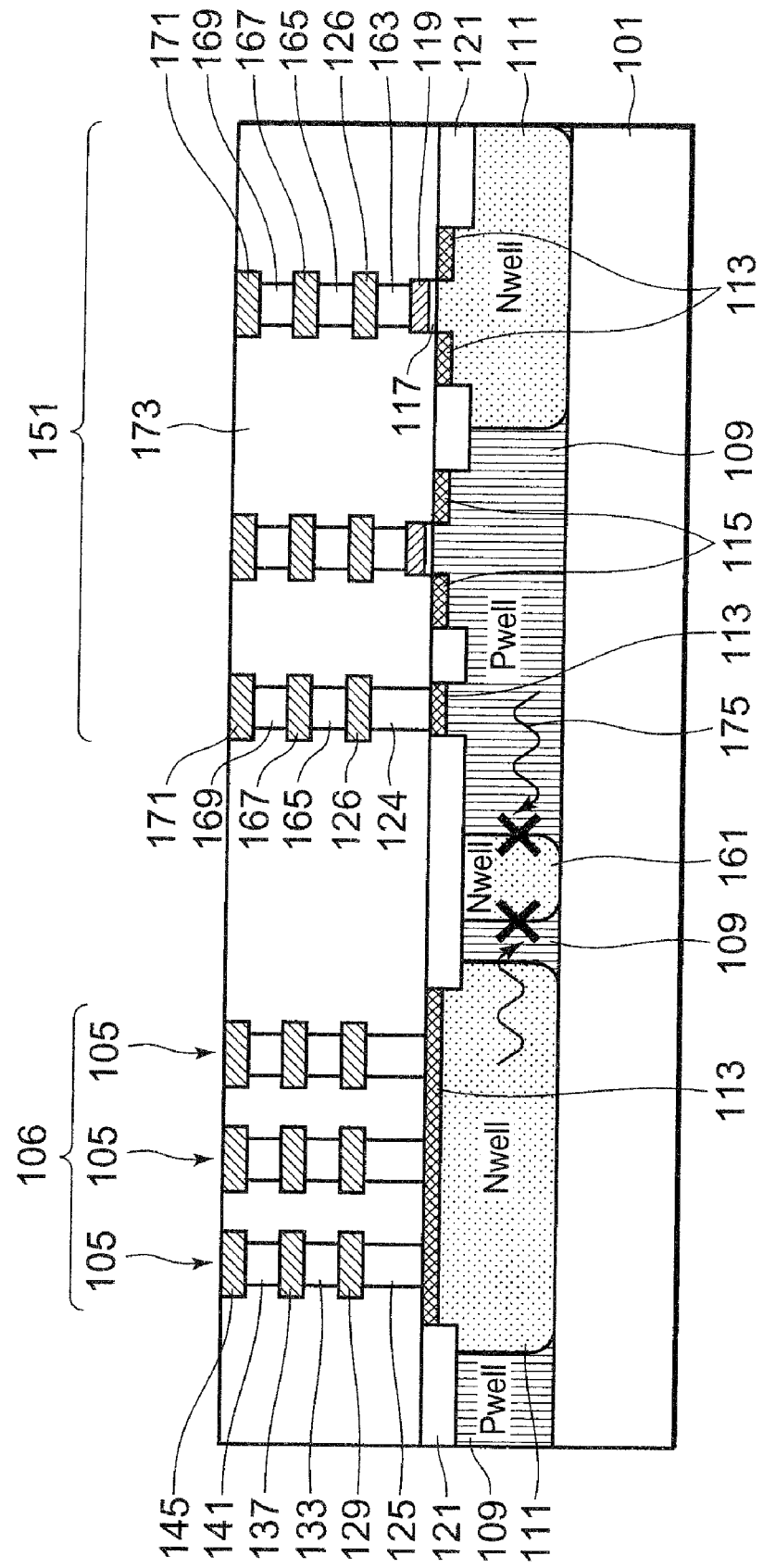
FIG. 2 is a cross sectional view taken on line A-A' of FIG. 1.

FIG. 1 shows a schematic top view of a configuration of a semiconductor device in this first embodiment. FIG. 2 shows a cross sectional view taken on line A-A' of the semiconductor device 100 shown in FIG. 1. In FIG. 2 is shown a configuration of a seal ring region 106 and an internal circuit of a logic unit 151 provided inside the seal ring region 106. The cross section of an analog unit 153 is the same as, for example, that of the logic unit 151.

The semiconductor device 100 shown in FIGS. 1 and 2 respectively includes a first device region (logic unit 151) and a second device region (analog unit 153). The logic unit 151 is device region that might become a source of noise 175 and the analog unit 153 is a device region that might become a damaged circuit.

The semiconductor device 100 includes a semiconductor substrate (silicon substrate 101), an insulating interlayer 173 provided on the silicon substrate 101, and a conductive film buried in the insulating interlayer 173. The semiconductor device 100 further includes a seal ring 105 surrounding the outer periphery of the logic unit 151, a well provided on the silicon substrate 101, and a blocking region (N well guard ring 161) composed of a well provided on the silicon substrate 101 and used for blocking the conduction of a path from the logic unit 151 to the analog unit 153 through the seal ring 105.

The analog unit 153 is disposed inside or outside the seal ring 105. In this first embodiment, the analog unit 153 is disposed inside the seal ring 105. And the seal ring 105 surrounds the outer periphery of the logic unit 151 and the analog unit 153 respectively.

In this first embodiment, three seal rings 105 are provided in the seal ring region 106. Hereinafter, the forming region of these three seal rings 105 will also be referred to as a seal ring region 106. The seal ring region 106 is provided along the dicing plane 103 of the silicon substrate 101 and surrounds the outer periphery of the logic unit 151 and the analog unit 153 respectively.

Each seal ring 105 is a laminated ring consisting of a first ring 125, a first wiring, a second ring 133, a second wiring 137, a third ring 141, and a third wiring 145 that are stacked sequentially from bottom in this order. Each of the first ring 125, the first wiring 129, the second ring 133, the second wiring 137, the third ring 141, and the third wiring 145 is a ring-like conductive film to be made concretely of such metal as copper (Cu), etc., and by a process such as a damascene process. The conductive film may include barrier metal. The first ring 125 may be made of tungsten (W).

In the seal ring region 106, a first diffusion layer (P+ diffusion layer 113) is provided near the surface of the silicon substrate 101. The conduction type of the first diffusion layer 113 is the same as that of the silicon substrate 101. And a second diffusion layer (N well 111) is provided so as to come in contact with the bottom face of the P+ diffusion layer 113. The conduction type of the second diffusion layer 111 is opposite to that of the silicon substrate 101.

The three seal rings 105 that constitute the seal ring region 106 are in contact with the P+ diffusion layer 113 respectively. Each of those seal rings 105 is in contact with the surface of the P+ diffusion layer 113 at the bottom face of the first ring 125. The side outer periphery of the P+ diffusion layer 113 is covered and insulated by a device isolating region 121 formed in a process such as STI (Shallow Trench Isolation).

The seal rings 105 are disposed from bottom to top of the insulating interlayer 173. The insulating interlayer 173 is, for example, a laminated film consisting of plural insulating films.

Next, a cross sectional configuration of the logic unit 151 will be described.

In the logic unit 151, an N well 111 and a P well 109 are provided so as to be adjacent to each other near the surface of the silicon substrate 101. In a region over the N well 111 are provided a gate insulating film 117, a gate electrode 119, and a P+ diffusion layer 113 that acts as a source/drain region. Also in a region over the P well 109 are provided a gate insulating film 117, a gate electrode 119, and an N+ diffusion layer 115 that acts as a source/drain region. At a side of the N+ diffusion layer 115, a P+ diffusion layer 113 is formed in a region over the P well 109. The P+ diffusion layer 113 and the N+ diffusion layer 115 are isolated from each other by a device isolating region 121.

The P+ diffusion layer 113 on the P well 109 is connected to a first plug 124. On the first plug 124 are stacked a first wiring 126, a second plug 165, a second wiring 167, a third plug 169, and a third wiring 171 to form a multilayer wiring structure.

The gate electrode 119 is connected to the first plug 163. Also on the first plug 163 are stacked a first wiring 126, a second plug 165, a second wiring 167, a third plug 169, and a third wiring 171 to form a multilayer wiring structure.

The first ring 125 and the first plug 124 are provided on the same level. Similarly, the first wiring 129 and the first wiring 126, the second ring 133 and the second plug 165, the second wiring 137 and the second wiring 167, the third ring 141 and the third plug 169, and the third wiring 145 and the third wiring 171 are provided on the same level respectively.

The N well guard ring 161 that acts as a blocking region is disposed between the seal ring forming region (seal ring region 106) and the logic unit 151 or the analog unit 153. In this embodiment, the N well guard ring 161 is provided between the seal ring region 106 and the logic unit 151 and between the seal ring region 106 and the analog unit 153 respectively. In a plan view, the N well guard ring 161 is a ring-like region surrounding the logic unit 151 and the analog unit 153 entirely.

The N well guard ring 161 is a well formed by doping predetermined conductive type (N type here) impurities into the silicon substrate 101. In this embodiment, the conduction type of the silicon substrate 101 is P type and that of the N well guard ring 161 is opposite to the conduction type of the silicon substrate 101. The N well guard ring 161 has the same impurity concentration profile in the substrate depth direction as that of the N well 111. The N well guard ring 161 is formed simultaneously with, for example, the N well 111 in the same process.

The N well guard ring 161 is provided closely to the logic unit 151 or the analog unit 153. In this embodiment, the N well guard ring 161 is close to both logic unit 151 and analog unit 153.

The conduction type of the N well guard ring 161 is opposite to that of a region (P well 109) in its adjacent silicon substrate 101 at its side and a PN junction is formed in a region in which the N well guard ring 161 comes in contact with the P well 109.

And a device isolating region 121 is provided so as to come in contact with the upper part of the N well guard ring 161. The device isolating region 121 may cover, for example, the top surface of the N well guard ring 161 entirely.

In FIGS. 1 and 2, the seal ring 105 is provided along the periphery (dicing plane 103) of the silicon substrate 101 and the N well guard ring 161 is provided at a side of the seal ring forming region, concretely inside the seal ring 105 and along the seal ring 105.

In the semiconductor device 100, the N well guard ring 161 is formed on the silicon substrate 101 in a region between the seal ring region 106 and the logic unit 151 and a side of the N well guard ring 161 acts as a PN junction with the P well 109. And a carrier depletion layer is formed near the boundary of this PN junction, thereby forming a capacity. In this embodiment, such capacities are disposed serially in a path from the logic unit 151 to the analog unit 153 through a seal ring 105. Consequently, a junction part acts as a blocking region and reduces the total sum of the capacity C in the above equation (1) and increases the impedance Z effectively in the path.

Next, a manufacturing method of the semiconductor device 100 will be described. A known method is used for manufacturing the semiconductor device 100.

At first, a device isolating region 121 (STI) is formed on a silicon substrate 101. Then, an $SiO_2$ film that acts as a gate insulating film 117 is formed on the silicon substrate 101. And a polycrystalline silicon film that acts as a gate electrode 119 is formed on the $SiO_2$ film, thereby a gate is formed at a predetermined position on the silicon substrate 110. After this, a P well 109 and an N well 111 are formed at predetermined positions near the surface of the silicon substrate 101. Then, a P+ diffusion layer 113 and an N+ diffusion layer 115 are formed at predetermined positions near the surface of the silicon substrate 101 above the P well 109 and the N well 111 respectively.

Then, an insulating film is formed all over the top surface of the silicon substrate 101 and a masking pattern is formed with use of a photolithography technique. At this time, an opening is formed in the upper part of the forming regions of the first plug 124 and the first plug 163 respectively. Then, the forming regions of the first ring 125, the first plug 124, and the first plug 163 are removed selectively to form recesses. After this, the surface of the silicon substrate 101 is covered entirely by a metallic film, which is a material of the first ring 125, the first plug 124, and the first plug 163. The metallic film consists of a barrier metal film formed by stacking a titanium (Ti) film and a titanium nitride (TiN) film sequentially from bottom in this order and further a tungsten (W) film formed thereon so as to come in contact with the barrier metal film and fill the recesses. Then, the metal film formed above the insulation film is removed with use of, for example, the CMP (Chemical Mechanical Polishing) method. As a result, the first ring 125, the first plug 124, and the first plug 163 are obtained.

After this, an insulating film is formed so as to cover the first ring 125, the first plug 124, and the first plug 163 respectively. Similarly, the forming regions of the first wiring 129 and the first wiring 126 are removed selectively to form recesses. Then, on the whole top surface of the insulating film are formed sequentially a barrier metal consisting of a tantalum (Ta) film and a tantalum nitride (TaN) film that are stacked sequentially from bottom in this order, as well as a Cu film formed so as to come in contact with the barrier metal film and fill the recesses. Furthermore, the metal film formed over the insulating film is removed with use of, for example, the CMP method. As a result, the first wirings 129 and 126 are obtained.

Similarly, the pairs of the second ring 133 and the second plug 165, the second wiring 137 and the second wiring 167, the third ring 141 and the third plug 169, and the third writings 145 and 171 are formed sequentially. This completes the forming of the semiconductor device 100. After this, a passivation film may be formed on the insulating interlayer 173 so as to cover the third wirings 145 and 171.

Each insulating film that constitutes the insulating interlayer 173 is, for example, an $SiO_2$ film. Those insulating films may also be low inductive capacity films. In this specification, a low inductive capacity film means, for example, a film having a specific inductive capacity k that is 3.5 or under. Examples of such a film include an SiOC film, a hydrogen polysiloxane film, a methylpolysiloxane film, a methyl hydrogen polysiloxane film, and those films which have been made porous. The low inductive capacity film may be made of an organic polymer.

Next, there will be described the effects of the semiconductor device 100 in this embodiment.

In the semiconductor device 100 in this embodiment, an N well guard ring 161 is provided between the logic unit 151 and the seal ring region 106 and between the analog unit 153 and the seal ring region 106 respectively. Consequently, noise transmission is suppressed effectively in the following portions.

(I) Noise transmission in the plane of the silicon substrate 101 in a region between the logic unit 151 and the seal ring region 106

(II) Noise transmission in the plane of the silicon substrate 101 in a region between the analog unit 153 and the seal ring region 106

The N well guard ring 161 forms a P well 109 and a PN junction at its side surface. Consequently, four PN junctions come to be provided in a region between the logic unit 151 and the seal ring 105 and in a region between the analog unit 153 and the seal ring 105 respectively. Totally, therefore, eight PN junctions are provided in a conductive path from the logic unit 151, through the seal ring 105 to the analog unit 153. Thus the capacity C in the above equation (1) is reduced favorably by reducing the capacity C in each PN junction. And as a result, the impedance Z is increased favorably by reducing the total capacity C in the path. This effect is achieved remarkably when c in the above equation is small. This is why the semiconductor device 100 can suppress low frequency noise transmission more effectively.

In the semiconductor device 100, it is also possible to form the N well guard ring 161 in the same process as that of the N well 111 provided for the logic unit 151 and the analog unit 153 respectively. Consequently, there is no need to prepare any manufacturing processes additionally to form the blocking region and this makes it easier to manufacture the semiconductor device 100.

Because the N well guard rings 161 are provided in the whole forming region of the seal ring 105 in the semiconductor device 100, noise transmission through the seal ring 105 and the silicon substrate 101 is suppressed more surely in comparison with the sixth embodiment to be described later.

In the semiconductor 100, a blocking part for suppressing noise transmission in the normal direction of the substrate is also provided in the seal ring region 106. Concretely, the first ring 125 in the bottom layer of the seal ring 105 is connected to the N well 111 through the P+ diffusion layer 113, so that the PN junction between the first ring 125 and the P+ diffusion layer 113, as well as the PN junction between the P+ diffusion layer 113 and the N well 111 come to act as blocking parts. Consequently, the semiconductor 100 comes to be structured so as to suppress noise transmission not only in the in-plane direction of the substrate, but also in the normal direction of the substrate, thereby noise transmission through the seal ring 105 is blocked surely.

As described above, in the semiconductor device 100, the transmission of the noise generated in the logic unit 151 to the analog unit 153 is suppressed by a path from, for example, the circulating silicon substrate 101, through the seal ring 105 to the silicon substrate 101. Consequently, each element of the analog unit 153 is prevented from malfunction. And because the semiconductor device 100 is structured so as to reduce the distribution of the digital noise in the device chip by the seal ring 105, it is favorably used, for example, for a semiconductor device integrated circuit in which both digital region and analog region are provided.

In the following embodiments, only differences from the first embodiment will be described.

Second Embodiment

In the semiconductor device 100 in the first embodiment, the noise blocking region is constituted by one N well guard ring 161. However, the number of N well guard rings is not limited especially in this second embodiment; for example, plural N well guard rings may be disposed in a concentric pattern in the plane of the substrate. Hereunder, there will be described this second embodiment that will take such a configuration.

Figure 3:
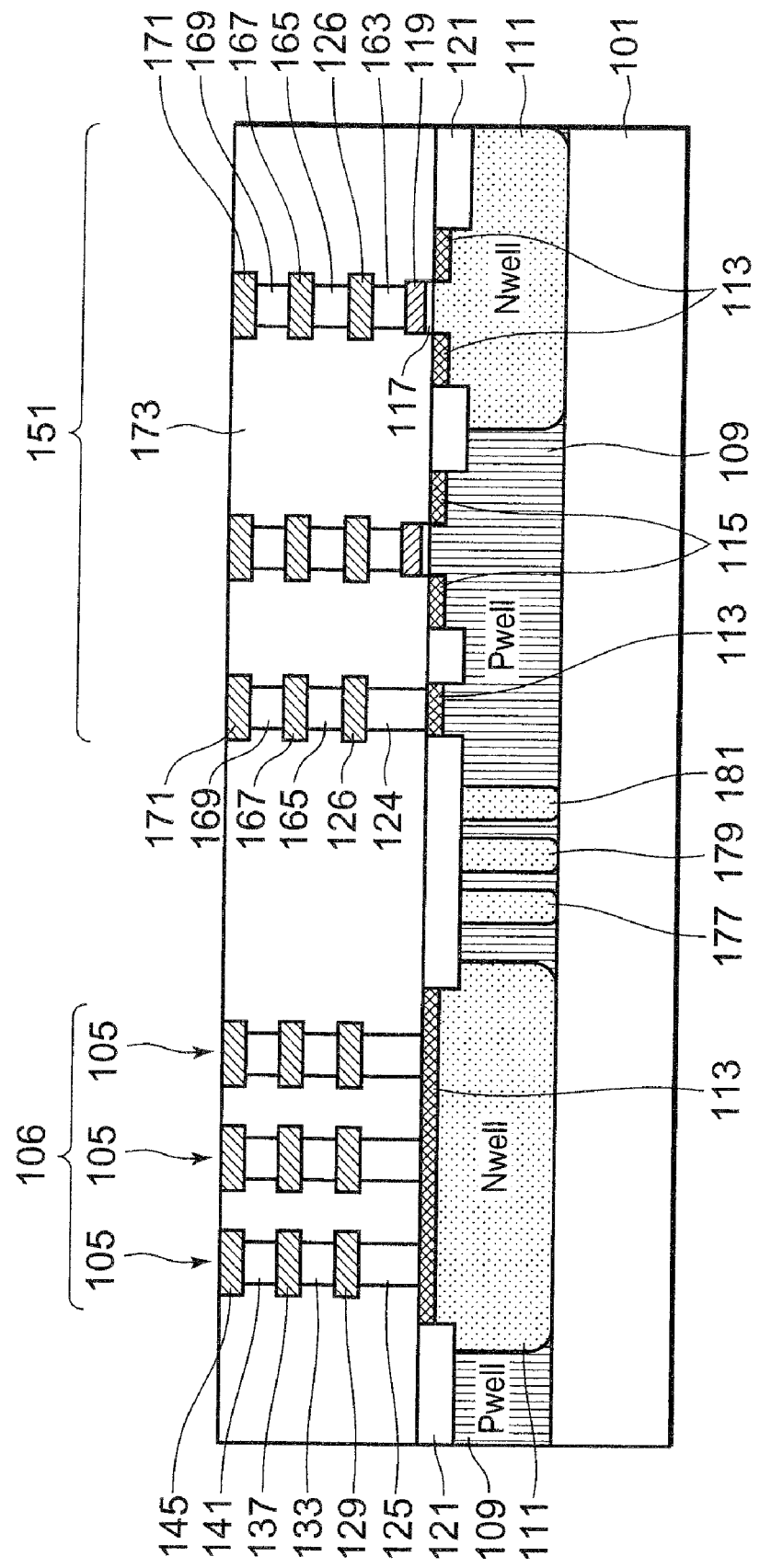
FIG. 3 is a cross sectional view of a configuration of a semiconductor device in the embodiment.

FIG. 3 shows a cross sectional view of a configuration of a semiconductor device in this second embodiment. Basically, the configuration is the same as that of the semiconductor device shown in FIG. 2 except that a first N well guard ring 177, a second N well guard ring 179, and a third N well guard ring 181 are provided instead of the N well guard ring 161. Also in this second embodiment, the cross sectional configuration of the analog unit 153 is the same as, for example, that of the logic unit 151.

Each of the first N well guard ring 177, the second N well guard ring 179, and the third N well guard ring 181 is an N well that acts as a blocking region. They are adjacent to each another through a P well 109. Those N wells are provided along the seal ring region 106 and inside the seal ring region 106. From the seal ring region 106 side are arranged sequentially the first N well guard ring 177, the second N well guard ring 179, and the third N well guard ring 181. Each of the first N well guard ring 177, the second N well guard ring 179, and the third N well guard ring 181 is a ring-like region provided along the entire periphery of the seal ring region 106.

In this second embodiment, there are provided plural N well guard rings (three in FIG. 3) in a region between the logic unit 151 and the seal ring 106 and in a region between the analog unit 153 and the seal ring 105 respectively in the in-plane direction of the substrate. Consequently, 8 PN junctions are formed serially so as to block the noise transmission in the in-plane direction of the silicon substrate 101 in the region between the logic unit 151 and the seal ring 106 and in the region between the analog unit 153 and the seal ring 105 respectively. In other words, there is increased the number of PN junction capacities disposed serially in the path from the logic unit 151, through the seal ring 105 to the analog unit 153. In comparison with the configuration in the first embodiment, therefore, the impedance Z in the above equation (1) is increased, thereby the noise transmission in the in-plane direction of the substrate is suppressed more effectively in this second embodiment.

In this second embodiment, it is also possible for each of the first N well guard ring 177, the second N well guard ring 179, and the third N well guard ring 181 to have plural chipped parts in part of the ring's circumferential direction and for those chipped parts to be disposed, concretely in a staggered pattern.

Figure 4:
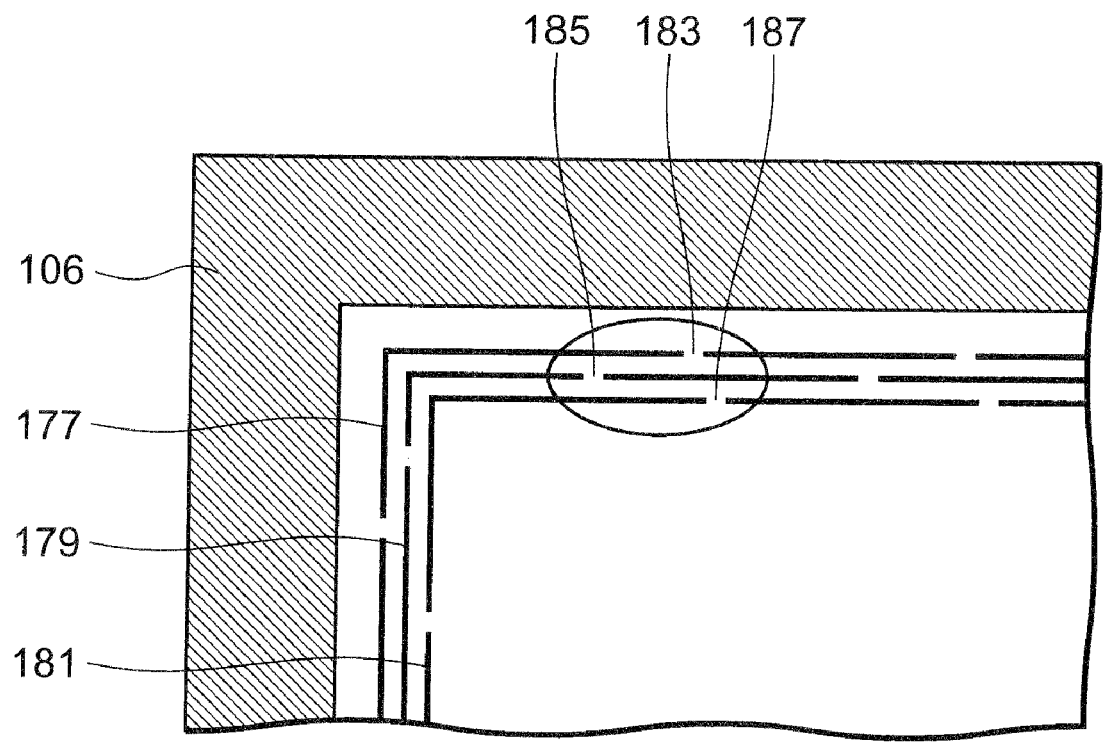
FIG. 4 is a top view of the semiconductor device in the embodiment.

FIG. 4 shows a top view of an N well guard ring configured as described above. In FIG. 4, the seal ring region 106 and the N well guard ring are shown only in part of the substrate plane.

In FIG. 4, each of the first N well guard ring 177, the second N well guard ring 179, and the third N well guard ring 181 has a first chipped part 183, a second chipped part 185, and a third chipped part 187. The first chipped part 183, the second chipped part 185, and the third chipped part 187 are disposed in a staggered pattern in a plan view.

Even while part of an N well guard ring is chipped as shown in FIG. 4, if it is avoided that the chipped parts are disposed linearly, noise transmission in the silicon substrate 101 is blocked effectively.

Third Embodiment

Figure 5:
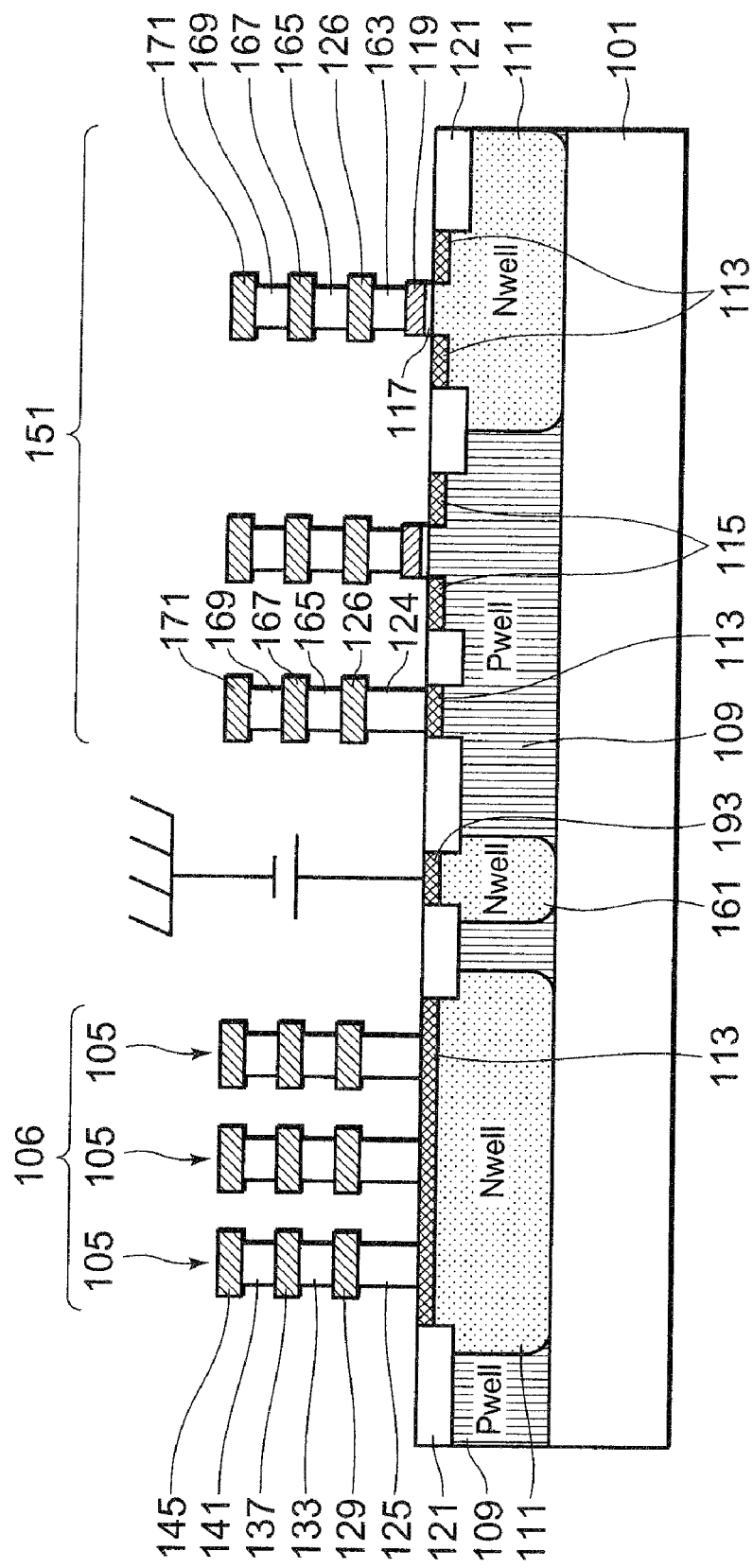
FIG. 5 is another cross sectional view of the configuration of the semiconductor device in the embodiment.

FIG. 5 shows a cross sectional view of a configuration of a semiconductor device in this third embodiment. Basically, the configuration of the semiconductor device shown in FIG. 5 is the same as that shown in FIG. 2 except that the N well guard ring 161 that constitute a blocking region is fixed at a predetermined potential. In FIG. 5, the N+ diffusion layer 193 is provided near the surface of the silicon substrate 101 over the N well guard ring 161. In FIG. 5, the insulating interlayer 173 is omitted. Also in this third embodiment, the cross sectional configuration of the analog unit 153 is the same as, for example, that of the logic unit 151.

The N+ diffusion layer 193 may be formed over the forming region of the N well guard ring 161 entirely. It is also possible to form the layer 193 in part of the N well guard ring forming region. The planar shape of the N+ diffusion layer 193 may also be changed to, for example, a ring-like shape. The outer periphery of a side surface of the N+ diffusion layer 193 is covered and insulated by a device isolating region 121 in a process such as STI (Shallow Trench Isolation).

According to this configuration, it is possible to set the potential of the P well 109 and keep the state stably to reduce the capacity of the junction part between the P well 109 and the N well guard ring 161. Consequently, noise transmission in the in-plane direction of the silicon substrate 101 is suppressed more stably.

Fourth Embodiment

In the semiconductor device described in each of the above embodiments, a deep N well in which impurities are injected deeply may be provided in a layer immediately under the N well guard ring.

Figure 6:
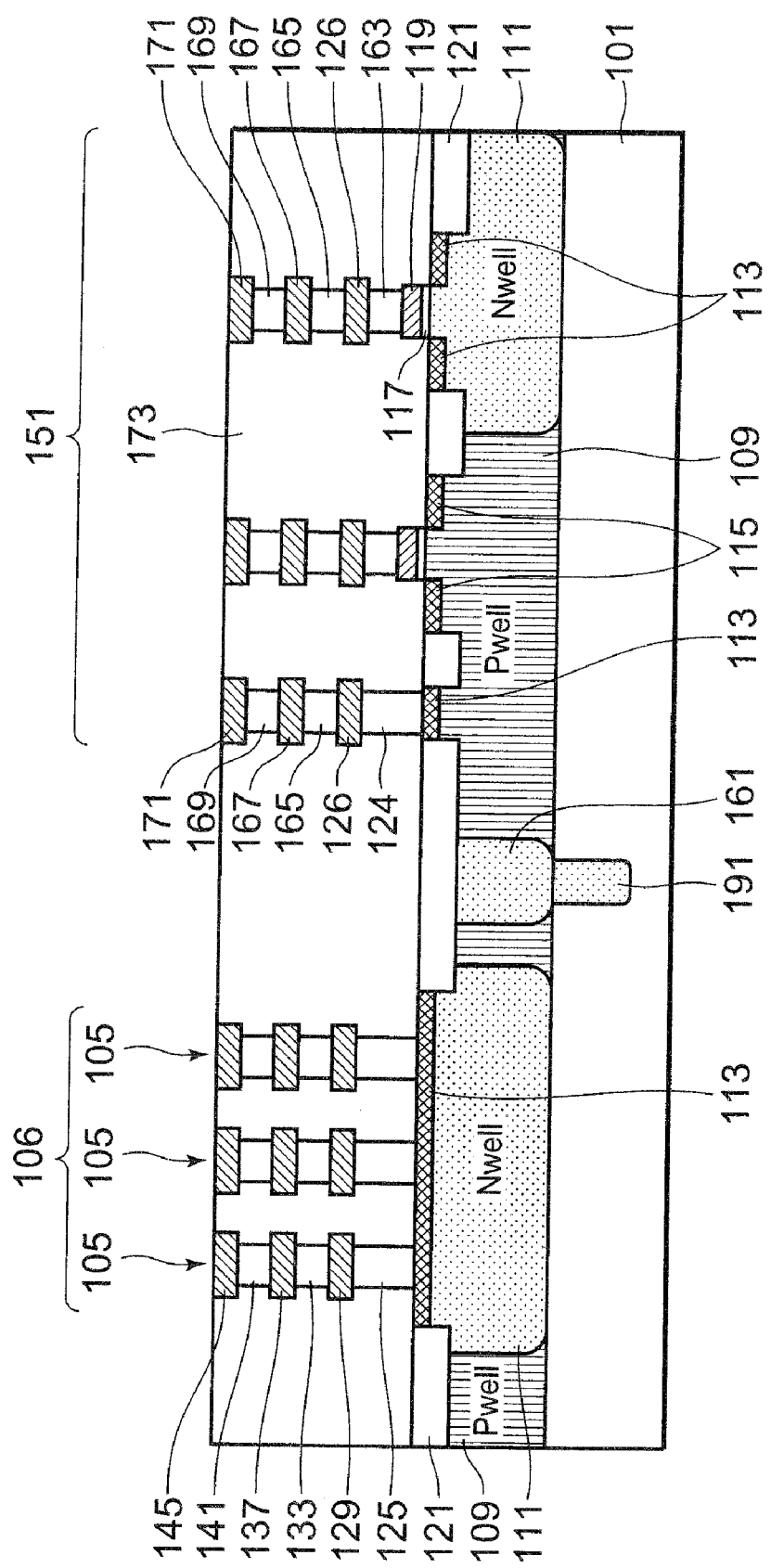
FIG. 6 is still another cross sectional view of the configuration of the semiconductor device in the embodiment.
Figure 7:
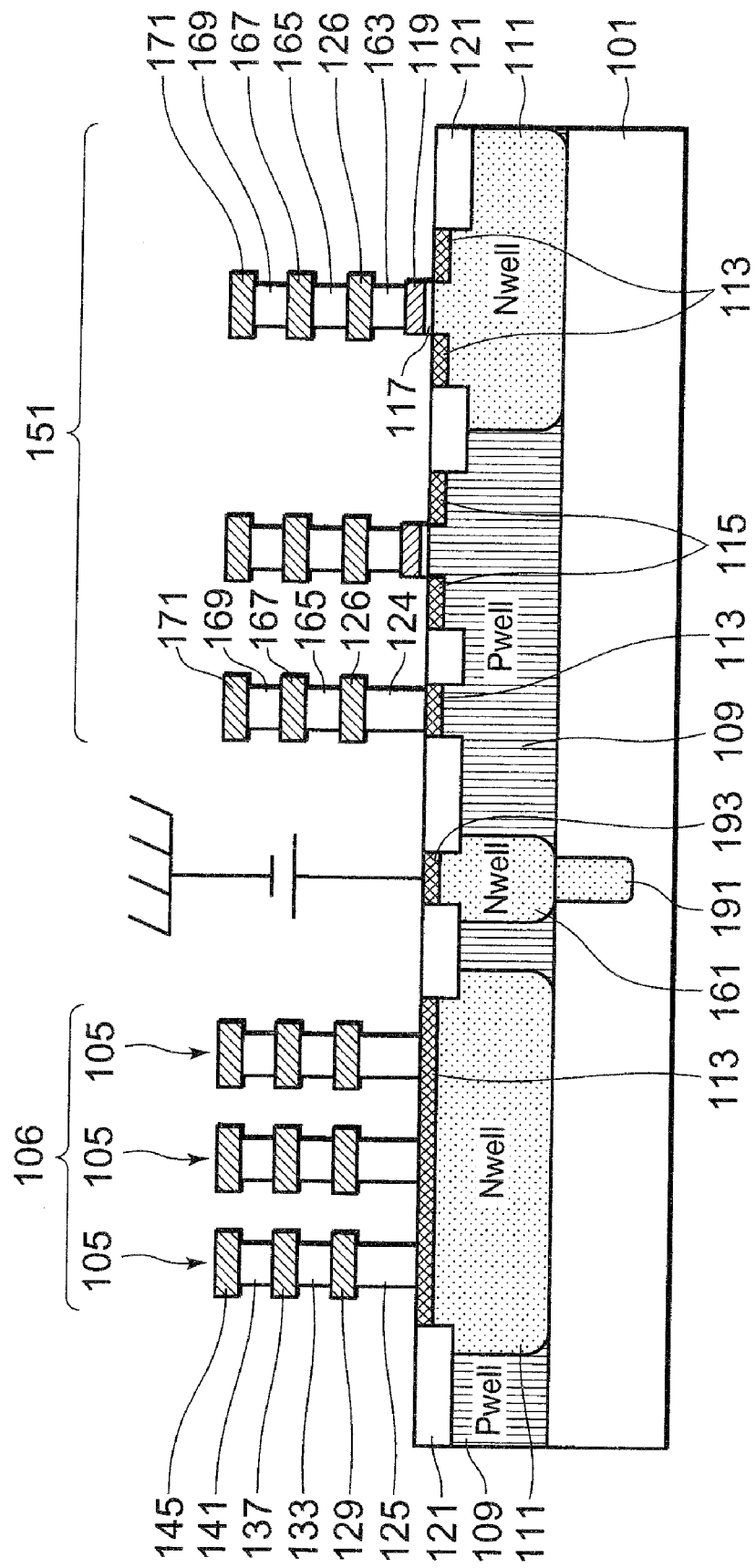
FIG. 7 is still another cross sectional view of the configuration of the semiconductor device in the embodiment.

FIGS. 6 and 7 show cross sectional views of such a configuration respectively. In FIGS. 6 and 7, only cross sectional views of the logic unit 151 are shown. The cross sectional configuration of the analog unit 153 is the same as, for example, that of the logic unit 151.

At first, FIG. 6 shows a configuration of the semiconductor (FIG. 2) in the first embodiment, in which a deep N well 191 is additionally provided in a layer immediately under the N well guard ring 161. The deep N well 191 is provided in a region deeper than the N well guard ring 161 of the silicon substrate 101. The deep N well 191 provided such way blocks noise transmission through the silicon substrate 101 more surely.

FIG. 7 shows a configuration of the semiconductor (FIG. 5) in the third embodiment, in which a deep N well 191 is provided additionally in a layer immediately under the N well guard ring 161. In FIG. 7, the insulating interlayer 173 is omitted.

In FIG. 7, the potential of the blocking region constituted by the N+ diffusion layer 193, the N well guard ring 161, and the deep N well 191 is fixed, so that the noise transmission in the in-plane direction of the substrate is blocked more stably.

Fifth Embodiment

In each of the first to fourth embodiments described above, an N well guard ring that acts as a blocking region is provided in a region between the logic unit 151 and the seal ring region 106 and in a region between the analog unit 153 and the seal ring region 106 respectively. And a PN junction is formed at a side surface of the N well guard ring, thereby increasing the impedance Z to generate a nonconducting state between the logic unit 151 and the analog unit 153 in the plane of the silicon substrate 101. The blocking region constituted by a well in the silicon substrate 101 is not limited only to such a configuration; the blocking region may be a well having the same conduction type as that of an adjacent region. In this fourth embodiment, there will be described a semiconductor device having a blocking region constituted by a P well.

Figure 8:
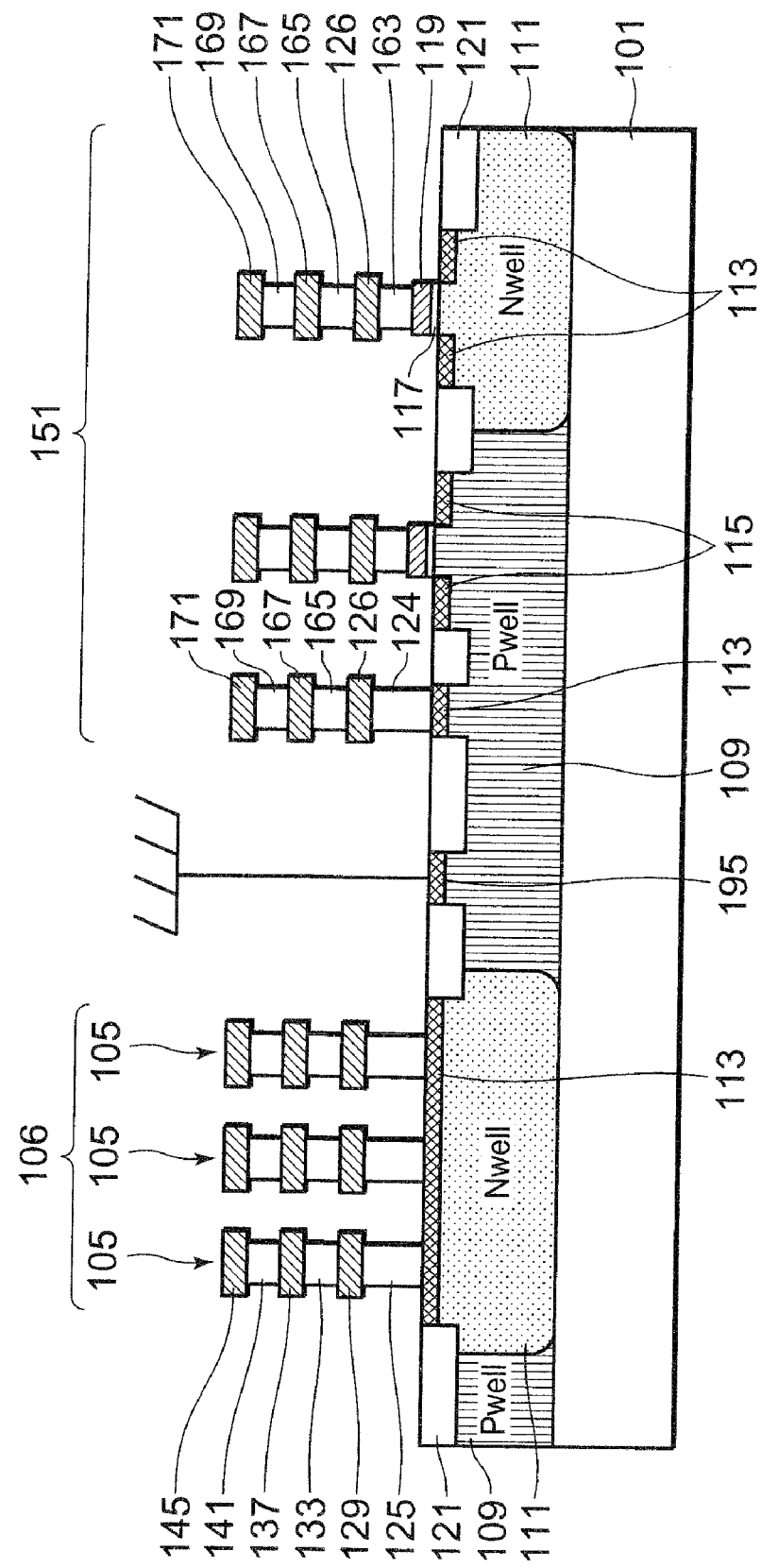
FIG. 8 is still another cross sectional view of the configuration of the semiconductor device in the embodiment.

FIG. 8 shows a cross sectional view of a configuration of a semiconductor device in this fifth embodiment. Basically, the configuration of the semiconductor device shown in FIG. 8 is the same as that shown in FIG. 2 except that a P+ guard ring 195 is provided instead of the N well guard ring 161 provided for the semiconductor device shown in FIG. 2 and the P+ guard ring 195 is fixed at a predetermined potential. In FIG. 8, the P+ guard ring 195 is grounded. In FIG. 8, the insulating interlayer 173 is omitted. Also in this fifth embodiment, the cross sectional configuration of the analog unit 153 is the same as, for example that of the logic unit 151.

The P+ guard ring 195 is a ring-like P+ well provided near the surface of the silicon substrate 101 and P-type impurities are doped therein. In this embodiment, P-type is employed as the conduction type of the silicon substrate 101 and the guard ring respectively. The P+ guard ring is provided along the seal ring region 106 and inside the seal ring region 106, for example, just like the N well guard ring 161 shown in FIG. 1. The P+ guard ring surrounds the outer periphery of the logic unit 151 and the analog unit 153 respectively.

The P+ guard ring 195 is connected to the P well 109 at its bottom. On the other hand, the side surface outer periphery of the P+ guard ring is covered and isolated by the device isolating region 121 formed in a process such as STI (Shallow Trench Isolation).

The potential of the P+ guard ring 195 is set so that the impedance Z in a conductive path of a current flowing from the P+ guard ring 195 to the outside of the silicon substrate 101 becomes small relatively with respect to the in-plane direction of the silicon substrate 101. Consequently, the current comes to flow easily from the P+ guard ring 195 to the outside of the silicon substrate 101.

In FIG. 8, the P well 109 is provided in a region between the N well 111 connected to the seal ring region 106 and the N well 111 formed under the gate electrode 119. The P well 109 constitutes the bottom layer of the P guard ring 195 and comes in contact with the P+ guard ring 195. Consequently, even the noise 175 reached to the P well is transmitted preferentially to the outside of the silicon substrate 101 through the P+ guard ring 195. As a result, the noise 175 can be escaped positively to the fixed potential side, so that the transmission of the noise 175 in the in-plane direction of the silicon substrate 101 is suppressed effectively.

How to form a conductive path from the P+ guard ring 195 to the outside of the silicon substrate 101 will be solved, for example, in the following configuration. A conductive film is formed so as to go through the insulating interlayer 173 (not shown) and come in contact with the P+ guard ring 195 at its bottom, then a predetermined voltage (e.g., a ground potential in FIG. 8) is applied to this insulating film or the conductive film connected electrically to the insulating film.

Sixth Embodiment

In each of the above first to fifth embodiments, an N well guard ring or P+ guard ring that acts as a blocking region is shaped like a closed endless ring. However, a well that acts as a blocking region is not necessarily a perfect ring; the periphery of the ring may be chipped partially.

Figure 9:
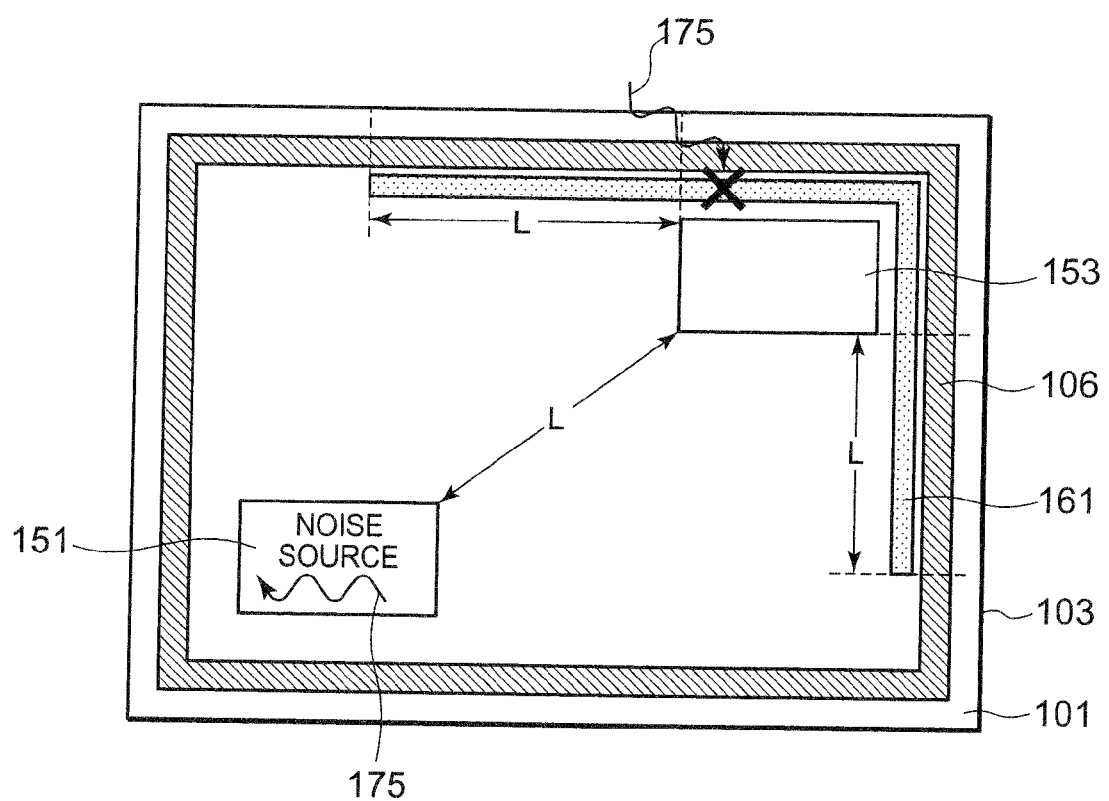
FIG. 9 is a top view of a schematic configuration of a semiconductor device in the embodiment.

In this sixth embodiment, such a configuration will be described with reference to the semiconductor device in the first embodiment. FIG. 9 shows a top view of a schematic configuration of a semiconductor device in this sixth embodiment. Basically, the configuration of the semiconductor device shown in FIG. 9 is the same as that shown in FIG. 1 except that the N well guard ring 161 is provided only in a region between the analog unit 153 that might become a damaged circuit and the seal ring region 106, and near the region respectively.

In FIG. 9, the N well guard ring 161 is provided outside the two sides of the analog unit 153 adjacent to the seal ring region 106. The two sides of the analog unit 153 are included in the outer periphery of the analog unit 153 having a roughly rectangular planar shape. And this N well guard ring 161 is formed in a region extended at least by a length L from an end part of the analog unit 153. The length L is the shortest distance between the logic unit 151 and the analog unit 153 in the plane of the substrate.

Even in a case where the N well guard ring 161 is formed so as to surround partially the periphery of the logic unit 151 or the analog unit 153 just like this embodiment, it is possible to suppress noise transmission from the logic unit 151 to the analog unit 513 through the seal ring 105 provided in the seal ring region 106 if the N well guard ring 161 is provided near a region in which the analog unit 153 that might become a damaged circuit comes in contact with the seal ring region 106.

Seventh Embodiment

In each of the above embodiments, both logic unit 151 and analog unit 153 are disposed inside the seal ring region 106. However, it is also possible to dispose only one of the logic unit 151 and the analog unit 153 inside the seal ring region 106; the other may be disposed outside the seal ring region 106.

Figure 10:
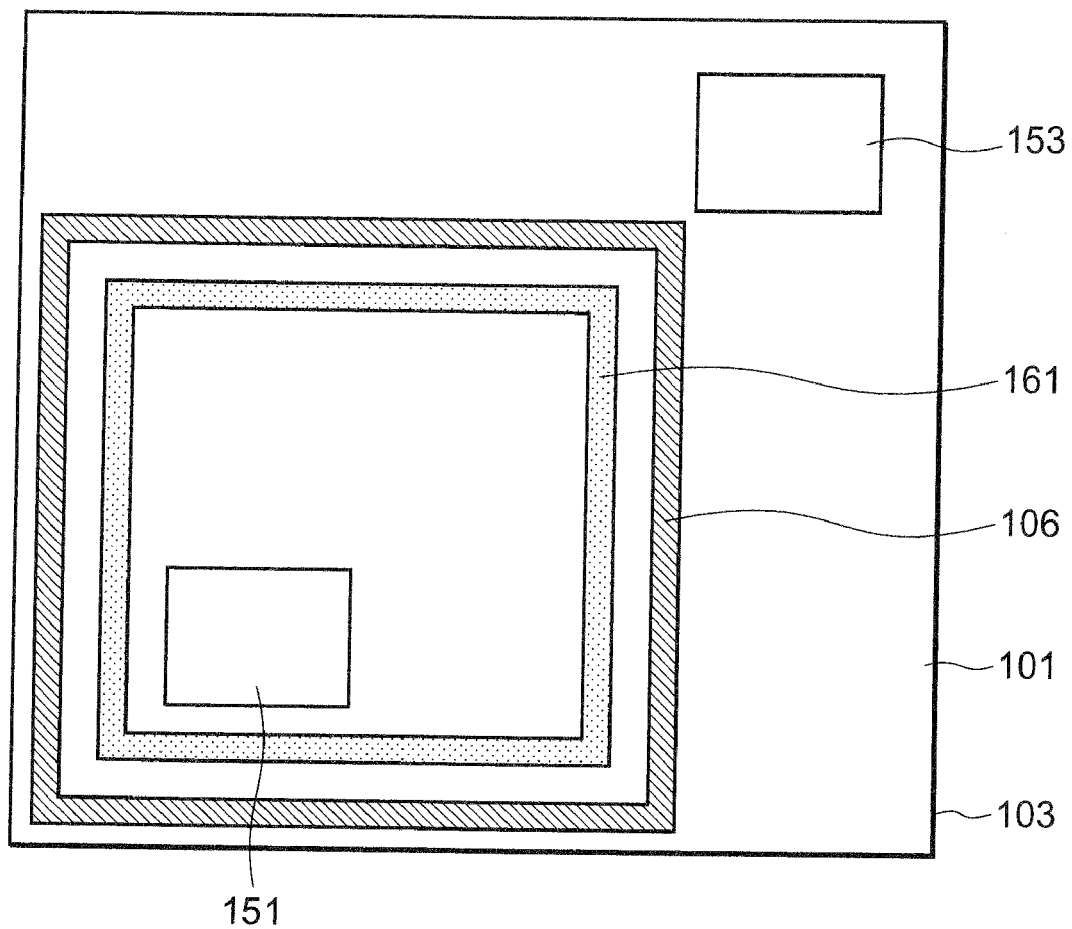
FIG. 10 is another top view of the schematic configuration of the semiconductor device in the embodiment.
Figure 11:
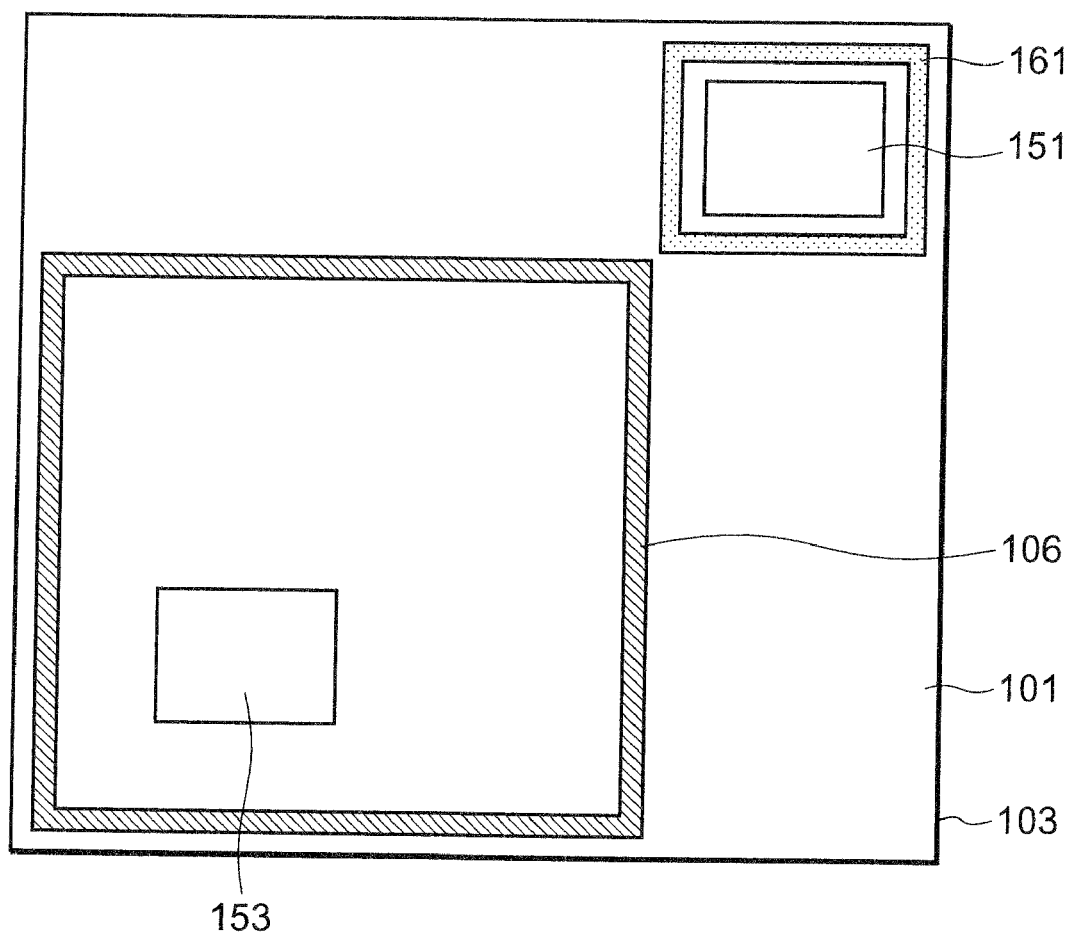
FIG. 11 is still another top view of the schematic configuration of the semiconductor device in the embodiment.

FIGS. 10 and 11 show top views of schematic configurations of such a semiconductor device.

At first, in FIG. 10, the logic unit 151 is disposed inside the seal ring region 106 provided on the silicon substrate 101 and the analog unit 513 is disposed outside the seal ring region 106. The N well guard ring 161 is a ring-like well provided inside the seal ring region 106 and along the seal ring region 106. The N well guard ring 161 surrounds the outer periphery of the logic unit 151.

In FIG. 11, the analog unit 153 is disposed inside the seal ring region 106 and the logic unit 151 is disposed outside the seal ring region 106. And the ring-like N well guard ring 161 is provided so as to surround the outer periphery of the logic unit 151.

Even in the configurations shown in FIGS. 10 and 11, the N well guard ring 161 is provided in a region between the logic unit 151 and the seal ring region 106 and in a region between the analog unit 153 and the seal ring region 106 respectively, so that this embodiment can obtain the same effect as that of each of the above embodiments.

While the embodiments of the present invention have been described with reference to the accompanying drawings, those are just examples of the present invention; the present invention can also apply to other configurations.

For example, in each of the above embodiments, the semiconductor device has both logic unit 151 and analog unit 153. However, the combination of those device regions in the semiconductor device is not limited only to that. For example, plural device regions is enabled to make a combination of a device region that might become a noise source and another device region that might become a damaged circuit. Concretely, there will be following device regions to be employed for those combinations: a digital circuit and a digital circuit, an analog circuit and an analog circuit, a digital circuit and a sensor, an analog circuit and a sensor, etc.

In each of the above embodiments, the semiconductor device has two device regions. However, the semiconductor device may have three or more device regions.

What is claimed is:

1. A semiconductor device including a first device region and a second device region, said semiconductor device comprising:

a semiconductor substrate;

an insulating interlayer formed on said semiconductor substrate;

a seal ring composed of a conductive film buried in said insulating interlayer so as to surround an outer periphery of said first device region;

a blocking region composed of a well provided on said semiconductor substrate and blocking electric conduction in a path from said first device region to said second device region through said seal ring;

a first diffusion layer formed in an upper part of said semiconductor substrate and in contact with said seal ring; and a second diffusion layer formed in contact with said first diffusion layer and covering said first diffusion layer, wherein said second device region is disposed in one of an inside and an outside of said seal ring, and wherein said blocking region is disposed between a seal ring region comprising said seal ring and one of said first device region and said second device region, wherein said blocking region is electrically isolated, wherein said blocking region is disposed between said second diffusion layer and said one of said first device region and said second device region, wherein a conduction type of said second diffusion layer is opposite to a conduction type of said first diffusion layer, and wherein said blocking region is a ring-like region surrounding a whole outer periphery of said one of said first device region and said second device region in a plan view.

2. The semiconductor device according to claim 1,
wherein said well forms a PN junction with a substrate region in said semiconductor substrate adjacent at a side surface of said well.

3. The semiconductor device according to claim 1,
wherein the conductive type of said well is N type.

4. The semiconductor device according to claim 3,
wherein said blocking region is composed of a plurality of ring-like N wells adjacent to each another through a P-type region.

5. The semiconductor device according to claim 4,
wherein each ring-like N well of said plurality of ring-like N wells has a plurality of chipped parts at which each of said plurality of ring-like N wells is divided, and
wherein said plurality of chipped parts are disposed as a staggered pattern.

6. The semiconductor device according to claim 3,
wherein said well is provided near a surface of said semiconductor substrate, and
wherein said blocking region includes a buried well connected to said well and provided immediately under said well.

7. The semiconductor device according to claim 2,
wherein said well is fixed at a predetermined potential.

8. The semiconductor device according to claim 1,
wherein said well has a same conductive type as a conductive type of an adjacent semiconductor region, and
wherein said well is fixed at a predetermined potential.

9. The semiconductor device according to claim 8,
wherein said well has a P conduction type.

10. The semiconductor device according to claim 1,
wherein said seal ring surrounds an outer periphery of said first device region and said second device region.

11. The semiconductor device according to claim 1,
wherein said blocking region is provided at a side of said seal ring and along said seal ring.

12. The semiconductor device according to claim 1,
wherein said seal ring is provided along a periphery of said semiconductor substrate, and
wherein said blocking region is provided inside said seal ring region and along said seal ring.

13. The semiconductor device according to claim 1,
wherein said blocking region does not overlap said seal ring region in a plan view.

14. The semiconductor device according to claim 1,
wherein both said first diffusion layer and said second diffusion layer are directly beneath said seal ring.

* * * * *